(12) United States Patent
Eberlein et al.

(10) Patent No.: US 9,110,145 B2
(45) Date of Patent: Aug. 18, 2015

(54) ACTIVATION OF FIELD COILS OF A MAGNETIC RESONANCE SYSTEM HAVING EDDY CURRENT COMPENSATION

(75) Inventors: Eva Eberlein, Baiersdorf (DE); Ralph Kimmlingen, Zirndorf (DE); Franz Schmitt, Erlangen (DE); Johann Schuster, Oberasbach (DE)

(73) Assignee: Siemens Aktiengesellschaft, München (DE)

( * ) Notice: Subject to any disclaimer, the term of this patent is extended or adjusted under 35 U.S.C. 154(b) by 601 days.

(21) Appl. No.: 13/554,870

(22) Filed: Jul. 20, 2012

(65) Prior Publication Data

US 2013/0187653 A1 Jul. 25, 2013

(30) Foreign Application Priority Data

Jul. 21, 2011 (DE) .......................... 10 2011 079 578

(51) Int. Cl.
*G01R 33/54* (2006.01)
*G01R 33/389* (2006.01)

(52) U.S. Cl.
CPC ............ *G01R 33/543* (2013.01); *G01R 33/389* (2013.01)

(58) Field of Classification Search
CPC .............................. G01R 33/543; G01R 33/389
See application file for complete search history.

(56) References Cited

U.S. PATENT DOCUMENTS

| | | | |
|---|---|---|---|
| 5,887,074 A * | 3/1999 | Lai et al. ........................ | 382/128 |
| 6,025,715 A | 2/2000 | King et al. | |
| 6,501,977 B1 | 12/2002 | Kimmlingen | |
| 7,567,836 B2 * | 7/2009 | Zhang ............................ | 600/512 |
| 8,781,197 B2 * | 7/2014 | Wang et al. .................... | 382/131 |
| 8,884,617 B2 * | 11/2014 | Goodwill et al. .............. | 324/301 |
| 8,965,094 B2 * | 2/2015 | Peacock et al. ............... | 382/131 |
| 2004/0046554 A1 | 3/2004 | Carlini | |
| 2009/0230964 A1 | 9/2009 | Kimmlingen et al. | |

FOREIGN PATENT DOCUMENTS

| DE | 198 57 514 A1 | 6/1999 |
|---|---|---|
| DE | 199 55 117 A1 | 5/2001 |

OTHER PUBLICATIONS

German Office Action dated May 7, 2012 for corresponding German Patent Application No. DE 10 2011 079 578.2 with English translation.

* cited by examiner

*Primary Examiner* — Dixomara Vargas
(74) *Attorney, Agent, or Firm* — Lempia Summerfield Katz LLC

(57) ABSTRACT

A controller of a magnetic resonance system determines an activation signal vector based on a target field predetermined for the controller in conjunction with field characteristics of field coils known to the controller. The activation signal vector includes a respective activation signal for each field coil. The controller determines the activation signal vector such that within a predetermined examination volume of the magnetic resonance system, any deviation of an ideal field that would result if ideal coils were subjected to the activation signals of the activation signal vector from the target field is minimized. The controller determines a compensation signal vector based on the activation signal vector in conjunction with eddy current characteristics of the field coils known to the controller. The compensation signal vector is used to minimize a deviation of an actual field from the target field within the predetermined examination volume of the magnetic resonance system.

20 Claims, 5 Drawing Sheets

FIG 6

$$B_j \in \left\{ \begin{pmatrix} X \\ 0 \\ 0 \end{pmatrix} ; \begin{pmatrix} 0 \\ X \\ 0 \end{pmatrix} ; \begin{pmatrix} 0 \\ 0 \\ X \end{pmatrix} \right\}$$

$$X \neq \begin{pmatrix} 1 \\ \pm 1 \\ \pm 1 \\ \pm 1 \end{pmatrix} b_{ij}$$

FIG 7

$$B_j = \begin{pmatrix} 1 \\ \pm 1 \\ \vdots \\ \pm 1 \end{pmatrix} b_{ij}$$

FIG 9

$$\Sigma |w_j| = \text{MAX} |w_j|$$

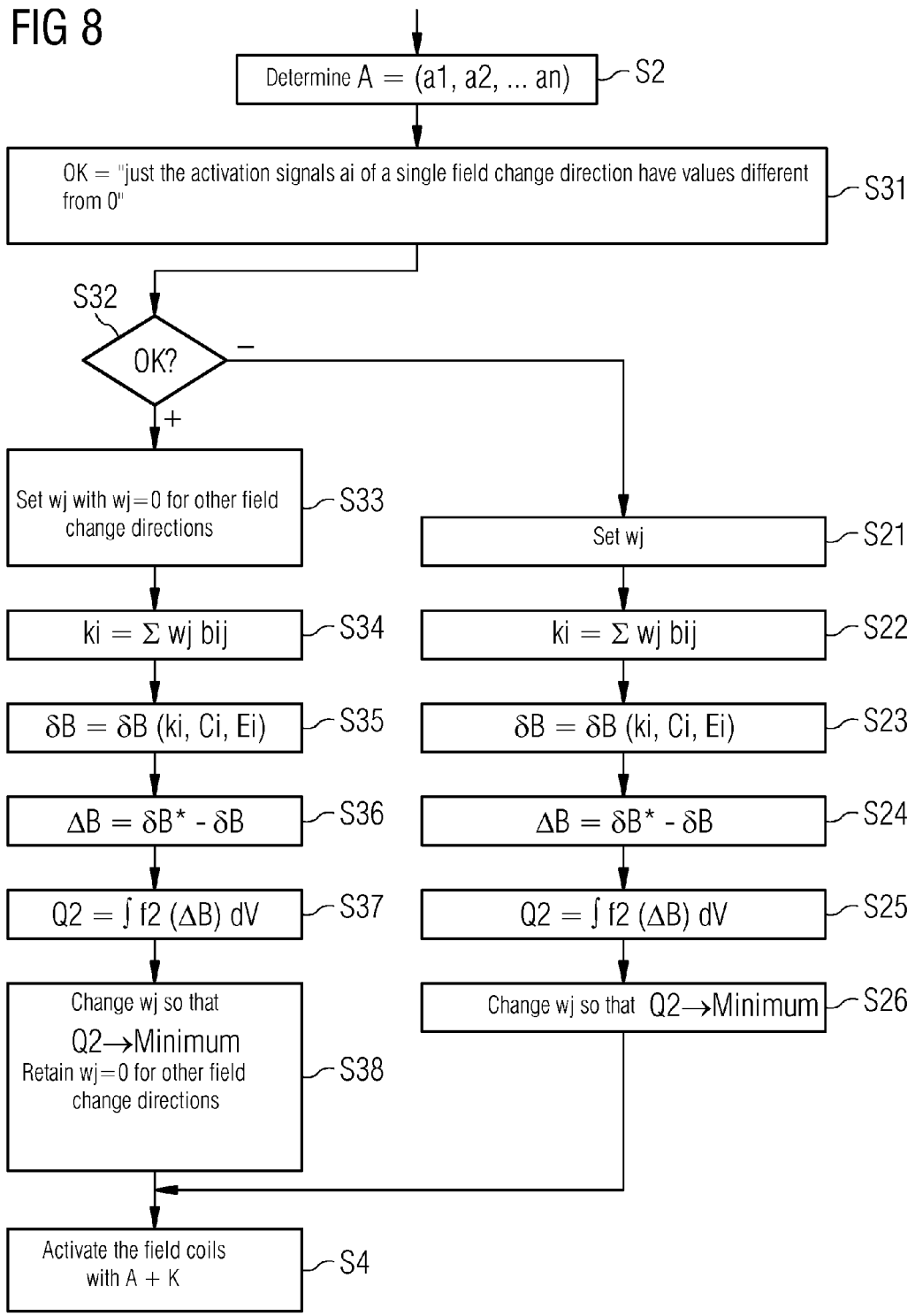

ACTIVATION OF FIELD COILS OF A MAGNETIC RESONANCE SYSTEM HAVING EDDY CURRENT COMPENSATION

This application claims the benefit of DE 10 2011 079 578.2, filed on Jul. 21, 2011.

BACKGROUND

The present embodiments relate to an activation method for a number of field coils of a magnetic coil system of a magnetic resonance system.

Magnetic resonance systems include, for example, a basic magnet that generates a temporally static, spatially essentially homogeneous basic magnetic field in an examination volume. The basic magnetic field may have a strength greater than 1 tesla. Basic magnetic field strengths of 1.5 tesla or 3 tesla may be used. An examination object (e.g., a patient) is introduced into the examination volume. The examination object is excited by a high-frequency system to emit magnetic resonance signals that are received by the same high-frequency system or a different high-frequency system and subsequently evaluated.

For spatial encoding, additional magnetic fields are overlaid on the basic magnetic field during excitation of the magnetic resonance signals, between excitation and the receiving of the magnetic resonance signals, and during the receiving of the magnetic resonance signals by field coils of a magnetic coil system of the magnetic resonance system. The overlaid magnetic fields may be oriented in the same direction as the basic magnetic field but are spatially different. The directions, along which the additional magnetic fields differ, may define a rectangular Cartesian coordinate system. The field coils may bring about an essentially linear field change (e.g., gradient fields) within the examination volume.

The magnetic fields generated by the field coils are followed very exactly with respect to the spatial field distribution. Otherwise, artifacts result during image reconstruction (e.g., when evaluating the received magnetic resonance signals). For example, the field coils are produced with a high level of mechanical precision. The field coils of the magnetic coil system may, however, only be produced with a mechanical precision in the millimeter range. It is difficult to achieve higher accuracy due to the tolerances of the parts used and the structural tolerances (e.g., a large number of individual layers have to be disposed on the smallest space). If high-voltage resistance and mechanical strength are to be achieved for field strengths above 1 tesla, there are further tolerances due to the vacuum casting process. Also, with the actively shielded field coils, the radial distance between the field-generating primary layer and the shielding layer is of significance. This distance is also subject to certain tolerances.

The residual scatter fields that are inevitable due to the finite length of the field coils and the finite number of conductor loops together with the scatter field due to tolerances induce an eddy current in the conductive surfaces of the magnetic resonance system. These induced eddy currents distort the spatial and temporal pattern of the magnetic fields generated in the examination volume and are therefore a potential cause of image artifacts.

The zero and first order components of the interference fields may be compensated for with the aid of the known eddy current compensation (ECC) method. The remaining higher-order interference fields vary with the manufacturing tolerance of the field coils and may not be compensated for in a conventional magnetic coil system. In the case of a gradient coil system, interference above the first order in the region of approximately 0.1% of a desired gradient strength is treated as acceptable.

In the case of magnetic resonance imaging, diffusion-weighted magnetic resonance sequences are used. To mark the magnetization (e.g., diffusion encoding), diffusion-weighted magnetic resonance sequences use a number of strong gradient pulses with a high amplitude-time integral. The orientation of the pulses defines the diffusion direction to be investigated in each instance. Diffusion sequences of the current prior art (e.g., DSI, HARDI, q-ball) measure proton diffusion not only in six orthogonal orientations but in many more orientations (e.g., 60 orientations). This is associated with a measurement time in the region of 10 minutes to 1 hour. The information thus obtained is used by tractography procedures to predict the pattern of nerve pathways (e.g., in the brain). Conventional gradient systems allow an amplitude of approximately 40 mT/m for such measurements. In the case of new systems that have a number of field coils for each gradient direction, this value increases to up to 300 mT/m. The amplitude of the eddy currents excited by the strong gradient pulses increases to the same degree.

To reduce interference fields, an improved production method may be used for the field coils (e.g., manufacturing the field coils with a higher level of precision). Once the field coils have been produced, the coil sensitivities may be fine-tuned. A further known solution is the dynamic activation (ECC) of additional higher-order field coils. This last solution is, however, associated with a high additional outlay, since at least one additional field coil is required for each interference field type. Also, for physical reasons, not all the higher-order interference fields may be compensated for independently of one another.

An activation method of the type mentioned in the introduction is known from DE 199 55 117 A1. With this method, the activation signals of the activation signal vector are determined using an optimization calculation. A target function that is a function of the activation signals and a measure of the deviation of the ideal field from the target field is established. The target function is minimized.

SUMMARY AND DESCRIPTION

The prior art procedure does not take into account the deviations of the field characteristics that result due to the production accuracies of the field coils.

The present embodiments may obviate one or more of the drawbacks or limitations in the related art. For example, the magnetic field resulting from the activation of the real field coils is optimized in a simple manner.

In one embodiment of an activation method, a controller determines a compensation signal vector based on an activation signal vector in conjunction with eddy current characteristics of field coils known to the controller. The compensation signal vector includes a respective compensation signal for each field coil. The compensation signal is used to minimize a deviation of an actual field that results when the field coils are subjected to the activation signals corrected by the compensation signals from the target field within the predetermined examination volume of the magnetic resonance system. The controller determines the compensation signal vector as the sum of basic compensation signal vectors weighted with respective weighting factors. The basic compensation signal vectors for each field coil include a respective basic compensation signal. The basic compensation signals for the respective field coil each have one of a number of discrete values, and the controller activates the field coils according to the activation signals corrected by the compensation signals.

This procedure reduces the number of basic compensation signal vectors to a manageable degree, so that the compensation signal vector may be determined with relatively little outlay.

The discrete values may include only the maximum permissible positive and negative current for the respective field coil. This minimizes the number of basic compensation signal vectors.

The magnetic coil system may include a number of field coils in each instance for a number of field change directions. The basic compensation signal vectors may, for the field change directions, at least span the complete space of the combinations of discrete values possible for the respective field change direction. This may be sufficient because only minor interactions may occur between the field coils for different field change directions. Alternatively, however, the basic compensation signal vectors may span the complete space of the possible combinations of discrete values for all the field change directions.

The controller may determine the compensation signal vector such that a single one of the weighting factors has a value different from zero. This procedure reduces the computation outlay significantly.

The compensation signal vector may be determined in the same way as the activation signal vector of the prior art. For example, the controller may establish a target function to determine the compensation signal vector, which includes the deviation of the actual field from the target field within the predetermined examination volume of the magnetic resonance system as a function of the weighting factors. The controller may also determine the weighting factors by minimizing the target function.

In one embodiment, the controller may take account of secondary conditions that additionally have to be met when minimizing the target function.

The activation method of the present embodiment is applied, for example, when the magnetic coil system includes a number of field coils for a number of field change directions. The activation method may be embodied in that if only the activation signals for a single field change direction have values different from zero, to minimize the target function, the controller only changes the weighting factors of the basic compensation signal vectors, for which the associated basic compensation signals act on the field coils of the respective field change direction. The controller allocates the value zero to the other weighting factors.

In one embodiment, a computer program is embodied such that the processing of machine code of the computer program by the controller causes the controller to execute an activation method of the present embodiments.

In another embodiment, a controller for a magnetic resonance system is programmed such that the controller executes an activation method of the present embodiments.

In yet another embodiment, a magnetic resonance system includes a controller that is configured to execute an activation method of the present embodiments.

BRIEF DESCRIPTION OF THE DRAWINGS

FIGS. 6 and 7 show exemplary basic signal compensation vectors;
FIG. 8 shows a flow diagram of one embodiment of a method for determining weighting factors;
and
FIG. 9 shows an exemplary condition to be taken into account.

DETAILED DESCRIPTION OF THE DRAWINGS

Figure 1:
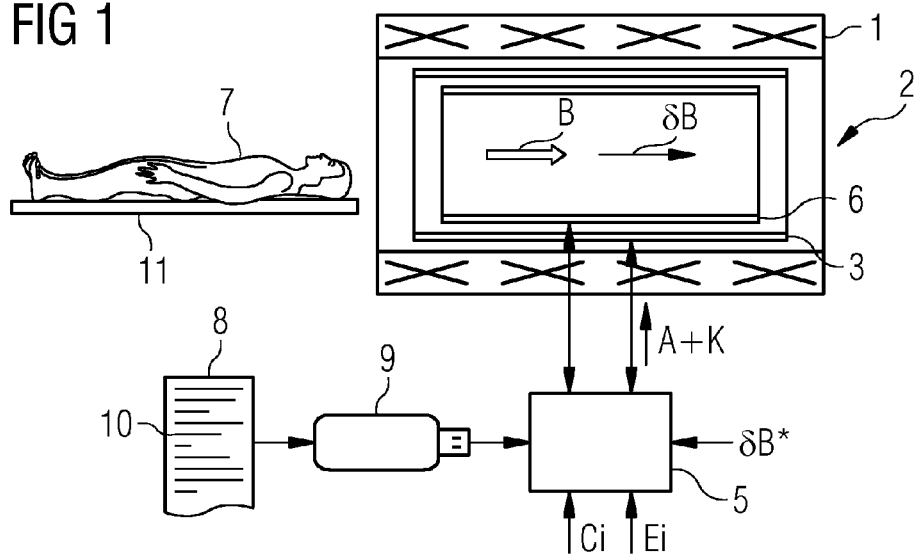
FIG. 1 shows one embodiment of a magnetic resonance system.
Figure 2:
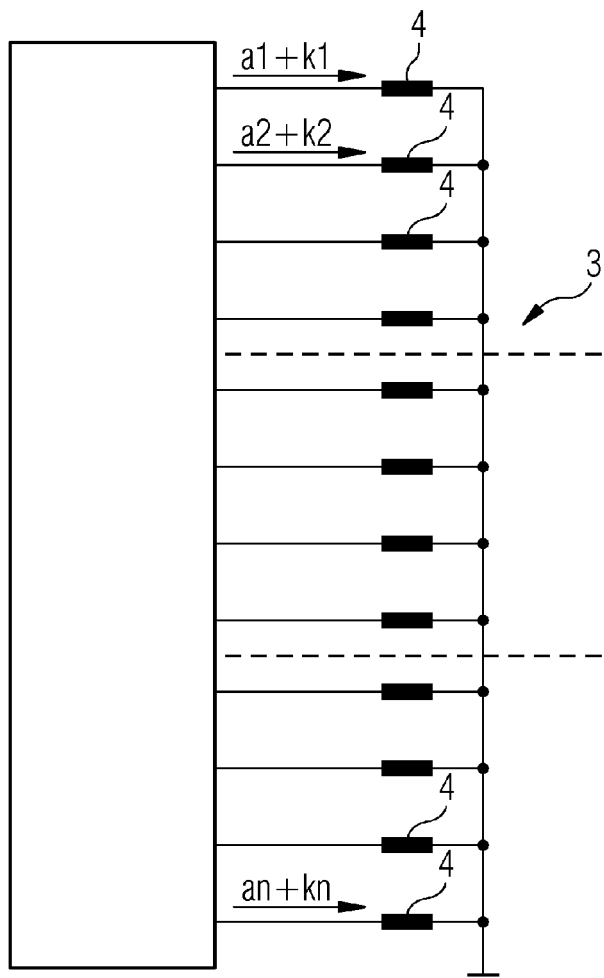
FIG. 2 shows one embodiment of a magnetic coil system.

According to FIG. 1, a magnetic resonance system has a basic magnet 1. The basic magnet 1 generates a temporally static, spatially essentially homogenous basic magnetic field B of, for example, 1.5 tesla or 3 tesla in an examination volume 2. The magnetic resonance system also has an activatable magnetic coil system 3. According to FIG. 2, the magnetic coil system 3 includes a plurality of field coils 4. The field coils 4 may be activated individually by a control facility 5 (e.g., a controller) of the magnetic resonance system. The field coils 4 of the magnetic coil system 3 are used to subject the examination volume 2 to a (magnetic) actual field δB, in addition to the basic magnetic field B, according to activation by the controller 5.

The actual field δB may have the same orientation as the basic magnetic field B. The strength of the actual field δB is, however, a function of location. For example, at least one of the field coils 4 in each instance may be used to generate a component of the actual field δB. The strength of the component of the actual field δB varies in one of two mutually orthogonal directions in each instance in the direction of orientation of the basic magnetic field B or in a plane orthogonal to the orientation of the basic magnetic field B. The spatial variation may be linear, for example. The field coils 4 form a gradient coil system of the magnetic resonance system. Higher-order fields may alternatively be generated.

The magnetic resonance system also has at least one high-frequency system 6. The high-frequency system 6 is activated by the controller 5. In transmit mode, the at least one high-frequency system 6 excites an examination object 7 to emit magnetic resonance signals if the examination object 7 has been introduced beforehand into the examination volume 2. In receive mode, the at least one high-frequency system 6 receives the previously excited magnetic resonance signals.

The controller 5 is configured as a controller that may be programmed using software. During operation, the controller 5 processes a computer program 8 including instructions that are used to program the controller 5. The computer program 8 may be supplied to the controller 5, for example, by way of a suitable data medium 9 (e.g., a non-transitory computer readable medium; USB memory stick, SD memory card, CD rom), on which the computer program 8 is stored in machine-readable form.

The computer program 8 includes machine code 10 (e.g., the instructions). The machine code 10 may be processed directly by the controller 5. Processing of the machine code 10 by the controller 5 causes the controller 5 to execute an activation method for the magnetic coil system 3, as described in more detail below in conjunction with FIG. 3 (and the further figures). The following does not include details of further control and evaluation actions of the controller 5 (e.g., the movement of a patient couch 11, on which the examination object 7 is disposed), the activation of the high-frequency system 6, or the evaluation of received magnetic resonance signals.

Figure 3:
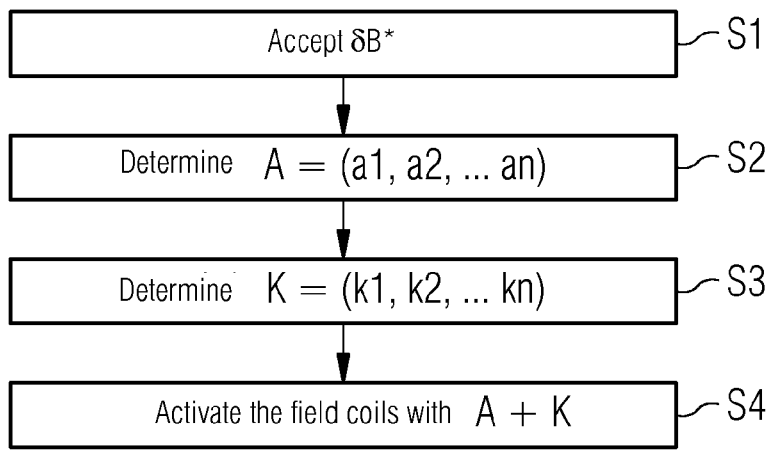
FIGS. 3 to 5 show flow diagrams of embodiments for an activation method for a magnetic coil system.

According to FIG. 3, in act S1, a target field δB* is predetermined for the controller 5 (e.g., a description of the magnetic field to be generated by the field coils 4 of the magnetic coil system 3). In act S2, the controller 5 determines an activation signal vector A. The activation signal vector A includes a respective activation signal ai (i=1, 2, ... n, where n is the number of field coils 4) for each field coil 4. Determination of the activation signal vector A is examined in more detail below in conjunction with FIG. 4. In act S3, the controller 5 determines a compensation signal vector K. The compensation signal vector K includes a respective compensation signal ki (i=1, 2, ... n) for each field coil 4, by which the corresponding activation signal ai of the activation signal vector A is corrected. In act S4, the controller 5 activates the field coils 4 according to the sum of activation signal vector A and compensation signal vector K. The controller 5 therefore activates the field coils 4 according to the activation signals ai corrected by the compensation signals ki.

Figure 4:
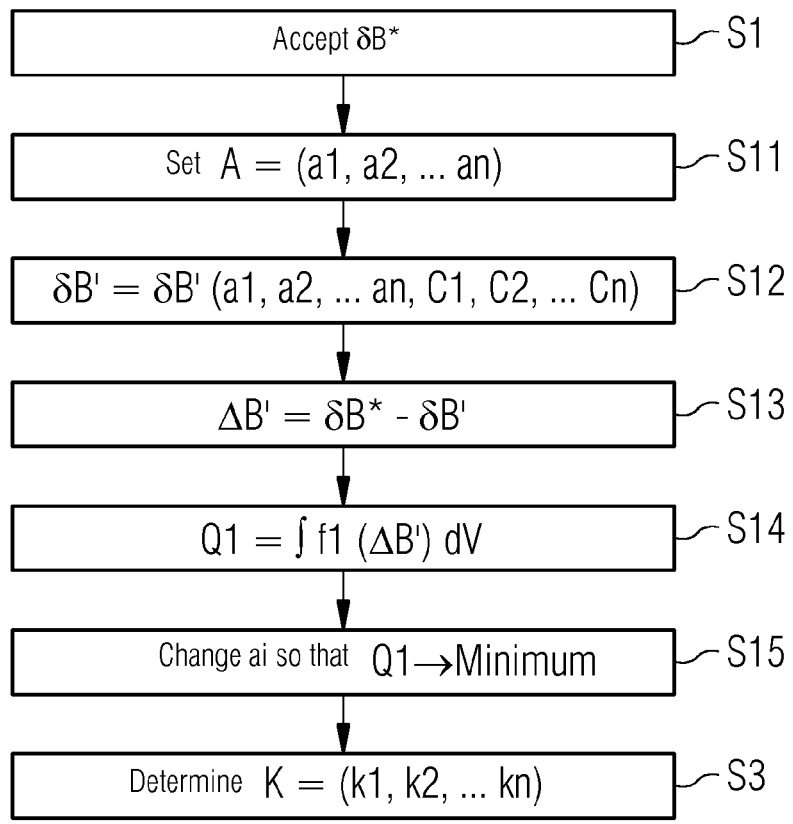

FIG. 4 shows an implementation of act S2 from FIG. 3. According to FIG. 4, act S2 from FIG. 3 is subdivided into acts S11 to S15.

In act S11, the controller 5 sets the activation signals ai to initial values. In act S12, the controller 5 determines an ideal field δB'. The ideal field δB' is the magnetic field that would result if the field coils 4 were ideal (e.g., all manufacturing and other tolerances had the value 0). Corresponding field characteristics Ci (i=1, 2, ... n) are stored within the controller 5, for example, as part of the computer program 8. The field characteristics Ci would result exactly, if fictional ideal coils that correspond ideally to the predefined field characteristics Ci, were subjected to the activation signals ai of the activation signal vector A. The fictional ideal coils are not idealized structures (it would be good if it were possible to build a coil with the field characteristic xy but this contradicts Maxwell's equations) but coils that are in principle completely feasible. It is assumed that all the manufacturing and other tolerances are eliminated.

In act S13, the controller 5 determines the ideal field deviation ΔB' (e.g., the difference between target field δB* and ideal field δB'). In act S14, the controller 5 establishes a first target function Q1. For example, the controller 5 determines a variable determined based on the ideal field deviation ΔB' within the examination volume 2. For example, the controller 5 may determine the mean square error, optionally weighted with a location-dependent further factor.

In act S15, the controller 5 minimizes the first target function Q1. For example, the controller 5 changes the activation signals ai, so that the ideal field deviation ΔB', optionally weighted in a location-dependent manner, is minimized within the examination volume 2. When changing the activation signals ai, the controller 5 may take account of, for each field coil 4, secondary conditions such as, for example, a respectively maximum permissible current (positive and negative), a maximum permissible current change, and a maximum permissible total current in all field coils 4.

Figure 5:
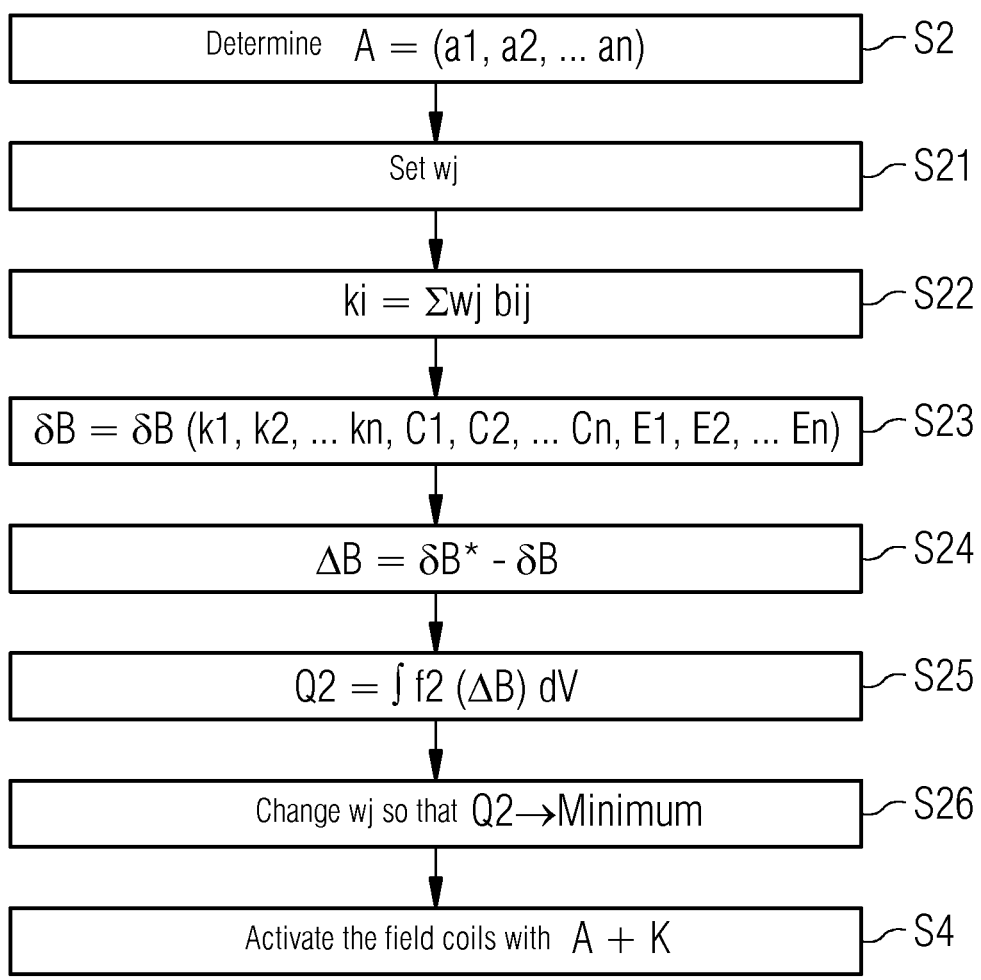

FIG. 5 shows an implementation of act S3 from FIG. 3. According to FIG. 5, act S3 from FIG. 3 is subdivided into acts S21 to S26.

In act S21, the controller 5 sets weighting factors wj (j=1, 2, 3, ... ) for basic compensation signal vectors Bj (j= 1, 2, 3, ... ) to provisional values. According to act S22, the compensation signal vector K corresponds to the sum of the corresponding basic compensation signal vectors Bj weighted with the weighting factors wj.

According to FIGS. 6 and 7, each basic compensation signal vector wj includes a respective basic compensation signal bij (i=1, 2, ..., n; j=1, 2, 3, ... ) for each field coil 4. For each basic compensation signal vector Bj, the basic compensation signals bij of the corresponding basic compensation signal vector Bj, which relate to a specific field coil 4, each have one of a number of discrete values. For example, the corresponding discrete values may include just the maximum permissible positive and negative current for the respective field coil 4 according to FIGS. 6 and 7. Optionally (see FIG. 6), further discrete values may also be possible (e.g., the value 0 according to FIG. 6).

In act S23, the controller 5 determines the actual field δB. The actual field δB is the magnetic field that results when the field coils 4 are subjected to the activation signals ai of the activation signal vector A determined in act S2 corrected by the compensation signals ki of the applied compensation signal vector K. Within the context of act S23, the controller 5 takes into account the activation signal vector A, the field characteristics Ci and additional eddy current characteristics Ei (i=1, 2, ... n) of the field coils 4. The eddy current characteristics Ei of the field coils 4 are the characteristics that describe the difference between the fields generated by the real field coils 4 due to eddy currents and the corresponding field characteristics Ci (e.g., the corresponding ideal coils). The eddy current characteristics Ei of the field coils 4 may be determined, for example, by measurement during production or commissioning of the magnetic resonance system and stored in the controller 5. The eddy current characteristics Ei of the field coils 4 may be part of the computer program 8.

In act S24, the controller 5 determines an actual field deviation ΔB (e.g., the difference between target field δB* and actual field δB). In act S25, the controller 5 establishes a second target function Q2. The controller 5 determines a variable determined based on the actual field deviation ΔB within the examination volume 2. For example, the controller 5 may determine the mean square error, optionally weighted with a location-dependent further factor. The further factor may be the same factor as the further factor mentioned in conjunction with act S14. Alternatively the further factor may be a different further factor.

In act S26, the controller 5 minimizes the second target function Q2. For example, the controller 5 changes the weighting factors wj, so that the deviation, optionally weighted as a function of location, of the actual field δB from the target field δB* is minimized within the examination volume 2. In one embodiment, the controller 5 takes secondary conditions into account when changing the weighting factors wj, as in act S15.

Acts S24 to S26 in FIG. 5 therefore correspond to acts S13 to S15 in FIG. 4. The difference is that within the context of acts S24 to S26, the actual field δB is used instead of the ideal field δB', and the weighting factors wj are changed instead of the activation signals ai.

The magnetic coil system 3 includes at least one field coil 4 for each field change direction. According to FIG. 2, a plurality of field coils 4 is present in each instance even for the field change directions (separated from one another in FIG. 2 by the corresponding broken lines). According to FIG. 6, the basic compensation signal vectors Bj may be subdivided into three groups. Each of the three groups is characterized in that the basic compensation signals bij of the basic compensation signal vectors Bj of the respective group each have the value 0 for the field coils 4 of two field change directions and values different from 0 for the third field change direction in each instance. Within the respective field change direction, however, according to FIG. 6, the basic compensation signal vectors Bj respectively span the complete space of the possible combinations of discrete values for the respective field change direction. Alternatively, the basic combination signal vectors Bj according to FIG. 7 may span the complete space of the possible combinations of discrete values for all the field change directions.

Regardless of whether the basic compensation signal vectors Bj span the space according to FIG. 6 or the space according to FIG. 7, the weighting factors wj may be determined as described below in conjunction with FIG. 8.

FIG. 8 includes acts S21 to S26, which were already described in conjunction with FIG. 5. These acts therefore are not described again. FIG. 8 also includes acts S31 to S38. Of acts S31 to S38, acts S34 to S37 correspond in content to acts S22 to S25, so that no further explanations are provided with respect to acts S34 to S37. Only acts S31 to S33 and act S38 are therefore examined in more detail below.

In act S31, the controller 5 determines the value of a logical variable OK. The logical variable OK only assumes the value TRUE if just the activation signals ai of a single field change direction have values different from 0 (e.g., the activation signals ai of the other field change directions are therefore identical to 0). In act S32, the controller 5 checks the value of the logical variable OK. Either acts S21 to S26 or acts S33 to S38 are executed, depending on the result of the check.

In act S33, the controller 5 sets the weighting factors wj, as in act S21. In act S33, only the weighting factors wj of the basic compensation signal vectors Bj are set, at least partially, to values different from 0, with which the associated basic compensation signals bij only act on the field coils 4 of the respective field change direction (e.g., on the field coils 4 of the field change direction, with which at least some of the activation signals ai have values different from 0). The controller 5 allocates the value 0 to the other weighting factors wj within the context of act S33. Act S33 therefore corresponds to a specific implementation of act S21.

Similarly, act S38 corresponds to a specific implementation of act S26, since in act S38, the weighting factors wj are changed in the same way as in act S26 and with the same target and the same basic and secondary conditions. However, within the context of act S38, the change is limited to the weighting factors wj, with which the basic compensation signals bij of the associated basic compensation signal vectors Bj only act on the field coils 4 of the respective field change direction.

The controller 5 may determine the compensation signal vector K in any manner both within the context of act S26 and within the context of act S38. The controller 5, however, may determine the compensation signal vector K such that only one of the weighting factors wj has a value different from 0. Only then does the relationship apply, according to FIG. 9, that the sum of the amounts of the weighting factors wj is equal to the weighting factor wj with the largest amount.

In one embodiment, it is assumed, for example, that four field coils 4 are present for each field change direction, and the field coils 4 of the field change direction running parallel to the orientation of the basic magnetic field B are to be activated in the same manner. It may also be assumed that the four field coils 4 have axial displacements of the coil positions compared with respective ideal positions. Such displacements essentially produce second order eddy field interference terms. If in such an instance only the two left field coils 4 are activated, the resulting field characteristic has half the field efficiency of the linear term of all four field coils 4. The air coil spectrum is identical to the air coil spectrum for an identical type of activation of all four field coils 4 apart from a few components. The difference is dominated by a second order term (B21). The extent of this term may be roughly over half the linear term (e.g., 60% of the linear term).

It may be further assumed that in the tune-up measurement a linear ECC amplitude of 1% and a B21 term of −0.3% are measured. The B21 term may be eliminated by adjusting the amplitude of the ECC pulses appropriately on the corresponding field change axis.

During conventional operation, the current ratio of the four field coils 4 in question is 1:1:1:1 (e.g., each of the relevant field coils 4 is subjected to 100% of the determined ECC term; with an ECC amplitude of 1%, the ECC term was determined with a 1% stronger current than in act S2 in FIG. 3 as a corresponding activation signal ai). In one embodiment, the adjustment does not take place with the ratio 1:1:1:1 but with the ratio 1.5:1.5:0.5:0.5. The two left field coils 4 are thus subjected to one and a half times the actually determined ECC term, and the two right field coils 4 are subjected to half the actually determined ECC term. As a result, the linear ECC term of 1% still acts in the center of the examination volume 2. However, a B21 term also acts with 60% of 0.5% (e.g., +0.3%). This compensates for the second order interference term caused by manufacturing tolerances.

Similar procedures may also be used for other field change directions.

The present embodiment may haves many advantages. For example, superior accuracy may be achieved in a simple manner when setting the actual field δB. Also, there is no need for additional hardware facilities (e.g., field coils 4, amplifiers, control facilities and the like). Instead, the present embodiment may be implemented with just software. Second order interference terms due to manufacturing tolerances and, where there are a sufficient number of field coils 4, in some instances also those of a higher order may be compensated for in a simple manner.

Although the invention is illustrated and described in detail using the exemplary embodiment, the invention is not limited by the disclosed examples. The person skilled in the art may derive other variations therefrom without departing from the scope of protection of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An activation method for a plurality of field coils of a magnetic coil system of a magnetic resonance system, the activation method comprising:

predetermining a target field by a controller of the magnetic resonance system;

determining, using the controller, an activation signal vector based on the predetermined target field in conjunction with field characteristics of the plurality of field coils known to the controller, the activation signal vector including a respective activation signal for each field coil of the plurality of field coils;

determining, using the controller, the activation signal vector such that within a predetermined examination volume of the magnetic resonance system, any deviation of an ideal field resulting when ideal coils corresponding ideally to the field characteristics of the plurality of field coils are subjected to the activation signals of the activation signal vector, from the target field is minimized;

determining, using the controller, a compensation signal vector based on the activation signal vector in conjunction with eddy current characteristics of the plurality of field coils known to the controller, the compensation signal vector comprising a respective compensation signal for each field coil of the plurality of field coils and being used to minimize a deviation of an actual field that results when the plurality of field coils are subjected to the activation signals corrected by the compensation signals, from the target field within the predetermined examination volume of the magnetic resonance system; and determining, using the controller, the compensation signal vector as the sum of basic compensation signal vectors weighted with respective weighting factors, wherein the basic compensation signal vectors comprise a respective basic compensation signal for each field coil of the plurality of field coils, wherein the basic compensation signals for the respective field coil each have one of a number of discrete values, and wherein the controller activates the plurality of field coils according to the activation signals corrected by the compensation signals.

2. The activation method as claimed in claim 1, wherein the discrete values comprise only the maximum permissible positive current and the maximum permissible negative current for the respective field coil.

3. The activation method as claimed in claim 1, wherein the plurality of field coils comprises a plurality of field coils for a plurality of field change directions, and wherein the basic compensation signal vectors for the plurality of field change directions at least span a complete space of the combinations of discrete values possible for the respective field change direction.

4. The activation method as claimed in claim 3, wherein the basic compensation signal vectors span the complete space of the possible combinations of discrete values for all the field change directions.

5. The activation method as claimed in claim 1, wherein the controller determines the compensation signal vector such that a single one of the weighting factors has a value different from zero.

6. The activation method as claimed in claim 1, further comprising:
establishing, using the controller, a target function to determine the compensation signal vector, the compensation signal vector comprising the deviation of the actual field from the target field within the predetermined examination volume of the magnetic resonance system as a function of the weighting factors; and
minimizing the target to determine the weighting factors.

7. The activation method as claimed in claim 6, wherein the controller takes account of secondary conditions that additionally are met when minimizing the target function.

8. The activation method as claimed in claim 6, wherein the plurality of field coils comprises a plurality of field coils for a plurality of field change directions, and wherein when only the activation signals for a single field change direction of the plurality of field change directions have values different from zero, the controller only changes the weighting factors of the basic compensation signal vectors (Bj), for which the associated basic compensation signals act on the field coils of the respective field change direction, to minimize the target function, and allocates the value zero to the other weighting factors.

9. The activation method as claimed in claim 2, wherein the plurality of field coils comprises a plurality of field coils for a plurality of field change directions, and wherein the basic compensation signal vectors for the plurality of field change directions at least span the complete space of the combinations of discrete values possible for the respective field change direction.

10. The activation method as claimed in claim 2, wherein the controller determines the compensation signal vector such that a single one of the weighting factors has a value different from zero.

11. The activation method as claimed in claim 3, wherein the controller determines the compensation signal vector such that a single one of the weighting factors has a value different from zero.

12. The activation method as claimed in claim 4, wherein the controller determines the compensation signal vector such that a single one of the weighting factors has a value different from zero.

13. The activation method as claimed in claim 2, further comprising:
establishing, using the controller, a target function to determine the compensation signal vector, the compensation signal vector comprising the deviation of the actual field from the target field within the predetermined examination volume of the magnetic resonance system as a function of the weighting factors; and
minimizing the target to determine the weighting factors.

14. The activation method as claimed in claim 3, further comprising:
establishing, using the controller, a target function to determine the compensation signal vector, the compensation signal vector comprising the deviation of the actual field from the target field within the predetermined examination volume of the magnetic resonance system as a function of the weighting factors; and
minimizing the target to determine the weighting factors.

15. The activation method as claimed in claim 4, further comprising:
establishing, using the controller, a target function to determine the compensation signal vector, the compensation signal vector comprising the deviation of the actual field from the target field within the predetermined examination volume of the magnetic resonance system as a function of the weighting factors; and
minimizing the target to determine the weighting factors.

16. The activation method as claimed in claim 5, further comprising:
establishing, using the controller, a target function to determine the compensation signal vector, the compensation signal vector comprising the deviation of the actual field from the target field within the predetermined examination volume of the magnetic resonance system as a function of the weighting factors; and
minimizing the target to determine the weighting factors.

17. The activation method as claimed in claim 7, wherein the plurality of field coils comprises a plurality of field coils for a plurality of field change directions, and wherein when only the activation signals for a single field change direction of the plurality of field change directions have values different from zero, the controller only changes the weighting factors of the basic compensation signal vectors (Bj), for which the associated basic compensation signals act on the field coils of the respective field change direction, to minimize the target function, and allocates the value zero to the other weighting factors.

18. In a non-transitory computer-readable storage medium that stores instructions executable by one or more controllers for a magnetic resonance system to execute an activation for a plurality of field coils of a magnetic coil system of the magnetic resonance system, the instructions comprising:

predetermining a target field for the one or more controllers of the magnetic resonance system;

determining an activation signal vector based on the predetermined target field in conjunction with field characteristics of the plurality of field coils known to the one or more controllers, the activation signal vector including a respective activation signal for each field coil of the plurality of field coils;

determining the activation signal vector such that within a predetermined examination volume of the magnetic resonance system, any deviation of an ideal field resulting when ideal coils corresponding ideally to the field characteristics of the plurality of field coils are subjected to the activation signals of the activation signal vector, from the target field is minimized;

determining a compensation signal vector based on the activation signal vector in conjunction with eddy current characteristics of the plurality of field coils known to the one or more controllers, the compensation signal vector comprising a respective compensation signal for each field coil of the plurality of field coils and being used to minimize a deviation of an actual field that results when the plurality of field coils are subjected to the activation signals corrected by the compensation signals, from the target field within the predetermined examination volume of the magnetic resonance system; and determining the compensation signal vector as the sum of basic compensation signal vectors weighted with respective weighting factors, wherein the basic compensation signal vectors comprise a respective basic compensation signal for each field coil of the plurality of field coils, wherein the basic compensation signals for the respective field coil each have one of a number of discrete values, and wherein the one or more controllers activate the plurality of field coils according to the activation signals corrected by the compensation signals.

19. An apparatus for a magnetic resonance system, the apparatus comprising:

a controller configured to:
predetermine a target field;

determine an activation signal vector based on the predetermined target field in conjunction with field characteristics of a plurality of field coils known to the controller, the activation signal vector including a respective activation signal for each field coil of the plurality of field coils;

determine the activation signal vector such that within a predetermined examination volume of the magnetic resonance system, any deviation of an ideal field resulting when ideal coils corresponding ideally to the field characteristics of the plurality of field coils are subjected to the activation signals of the activation signal vector, from the target field is minimized;

determine a compensation signal vector based on the activation signal vector in conjunction with eddy current characteristics of the plurality of field coils known to the controller, the compensation signal vector comprising a respective compensation signal for each field coil of the plurality of field coils and being used to minimize a deviation of an actual field that results when the plurality of field coils are subjected to the activation signals corrected by the compensation signals, from the target field within the predetermined examination volume of the magnetic resonance system; and determine the compensation signal vector as the sum of basic compensation signal vectors weighted with respective weighting factors, wherein the basic compensation signal vectors comprise a respective basic compensation signal for each field coil of the plurality of field coils, wherein the basic compensation signals for the respective field coil each have one of a number of discrete values, and wherein the controller is configured to activate the plurality of field coils according to the activation signals corrected by the compensation signals.

20. A magnetic resonance system comprising:
a basic magnet;
an activatable magnetic coil system;
at least one high-frequency system; and
a controller configured to
predetermine a target field;

determine an activation signal vector based on the predetermined target field in conjunction with field characteristics of a plurality of field coils known to the controller, the activation signal vector including a respective activation signal for each field coil of the plurality of field coils;

determine the activation signal vector such that within a predetermined examination volume of the magnetic resonance system, any deviation of an ideal field resulting when ideal coils corresponding ideally to the field characteristics of the plurality of field coils are subjected to the activation signals of the activation signal vector, from the target field is minimized;

determine a compensation signal vector based on the activation signal vector in conjunction with eddy current characteristics of the plurality of field coils known to the controller, the compensation signal vector comprising a respective compensation signal for each field coil of the plurality of field coils and being used to minimize a deviation of an actual field that results when the plurality of field coils are subjected to the activation signals corrected by the compensation signals, from the target field within the predetermined examination volume of the magnetic resonance system; and determine the compensation signal vector as the sum of basic compensation signal vectors weighted with respective weighting factors, wherein the basic compensation signal vectors comprise a respective basic compensation signal for each field coil of the plurality of field coils, wherein the basic compensation signals for the respective field coil each have one of a number of discrete values, and wherein the controller is configured to activate the plurality of field coils according to the activation signals corrected by the compensation signals.

\* \* \* \* \*